United States Patent [19]
Alpaiwalla et al.

[11] Patent Number: 4,678,929
[45] Date of Patent: Jul. 7, 1987

[54] RADIO FREQUENCY SWITCH

[75] Inventors: Feroz K. Alpaiwalla; Robert H. Begeman, both of Indianapolis, Ind.

[73] Assignee: RCA Corporation, Princeton, N.J.

[21] Appl. No.: 781,633

[22] Filed: Sep. 30, 1985

[51] Int. Cl.[4] .................... H01H 63/36; H04N 5/22
[52] U.S. Cl. .................................. 307/112; 307/146; 307/154; 307/243; 307/241; 358/194.1; 358/181; 328/104
[58] Field of Search ............... 307/112, 146, 154, 592, 307/596, 241–244, 246; 340/286 R, 310 R, 825.23, 825.24, 825.71, 825.69, 825.72; 358/194.1, 181; 328/104; 333/100, 101, 103, 104, 105, 109, 2

[56] References Cited

U.S. PATENT DOCUMENTS

| | | | |
|---|---|---|---|
| 3,047,741 | 7/1962 | Snow | 307/243 |
| 3,374,364 | 3/1968 | Concelman | 307/241 X |
| 3,459,968 | 8/1969 | Kraus | 307/244 X |
| 3,702,898 | 11/1972 | Webb | 358/181 |
| 4,400,735 | 8/1983 | Strammello | 358/181 |
| 4,492,937 | 1/1985 | Theriault | 333/103 |
| 4,519,002 | 5/1985 | Amano | 358/194.1 X |
| 4,521,810 | 6/1985 | Nigborowicz et al. | 358/181 |
| 4,527,136 | 7/1985 | Kamiya | 333/104 X |
| 4,575,759 | 3/1986 | Griepentrog et al. | 358/181 |

FOREIGN PATENT DOCUMENTS 1068216 5/1967 United Kingdom .
2126033A 3/1984 United Kingdom .

OTHER PUBLICATIONS

U.S. Application Ser. No. 535,707, filed 9/26/83-Tamer et al., "Single-Pole Multi-Throw Signal Switch for Modular Audio-Visual Systems".

Article by R. C. Gerdes, p. 73, High-Level Analog Switch.
National Semiconductor Corporation "Linear Applications Handbook", bearing cover date 1978, p. AN32-12 of Application Note 32, dated 1970, on p. AN32-1.

Primary Examiner—William M. Shoop, Jr.
Assistant Examiner—Shik Luen Paul Ip
Attorney, Agent, or Firm—Paul J. Rasmussen; Peter M. Emanuel; Adel A. Ahmed

[57] ABSTRACT

In a radio frequency switch, a pair of diodes is coupled in series with polarities opposed between input and output ports. A shunt diode is coupled between the junction point of the pair of diodes and a point of reference potential. A transistor has its main conduction path coupled between the junction point and the point of reference potential. When the switch is to couple a signal between the input and output ports, a control arrangement applies bias tending to forward bias the pair of diodes, to reverse bias the shunt diode and cut off conduction through the transistor. When the switch is not to couple a signal, the control arrangement applies bias tending to reverse bias the pair of diodes, forward bias the shunt diode, and to bias the transistor into a highly conductive condition, thereby further reducing any difference of potential between the junction point and the point of AC reference potential and cooperating with the bias potential tending to forward bias the shunt diode and reverse bias the pair of diodes. In another embodiment, one diode of the pair of diodes is coupled to the junction point by way of a low-pass filter which does not substantially affect a signal to be coupled but exhibits a high series impedance which increases the attenuation when the switch is not to couple a signal.

18 Claims, 1 Drawing Figure

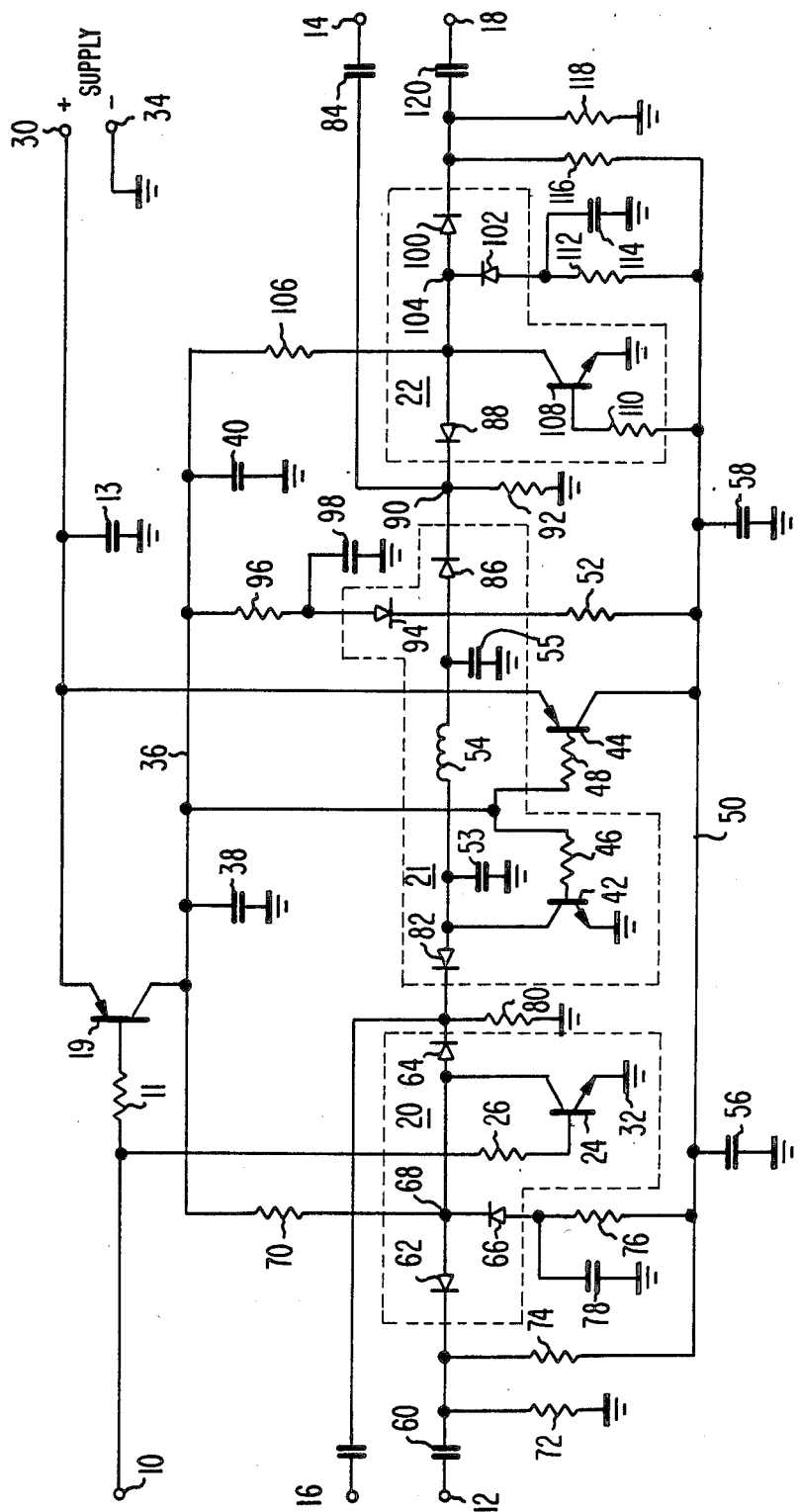

RADIO FREQUENCY SWITCH

The present invention relates to switches, and more particularly, to switches suitable for handling high radio frequencies (RF) such as are used for television carrier waves.

In television systems, it is frequently convenient to couple a selected one of a plurality of signal sources, such as an antenna, a video cassette recorder, or a cable television outlet to a load device, such as a television receiver or a video cassette recorder. It is also frequently convenient to couple a non-selected one of the plurality of sources to an outlet point so as to make it available for application to another load device.

Switches using series and shunt diodes are commonly employed for RF switching between an input port and an output port. When the switch is "OFF", i.e. not passing a signal, the series diodes are reverse biased and exhibit a small capacitance, while the shunt diodes are forward biased and exhibit a low resistance. High attenuation in the "OFF" condition is desirable between the input port and the ouput port and to achieve this, the reverse-biased diode capacitance should be very small. However, this generally requires a high reverse bias voltage. Furthermore, the resistance of the shunt diode should be very low. The resistance is lowered by using a relatively large forward bias current, though this has the attendant disadvantage of requiring relatively large power dissipation. In some cases it is found that a still lower shunt resistance is needed to achieve the high attenuation required for an RF signal switch than can be conveniently achieved by using a shunt diode alone.

In accordance with an aspect of the invention, switch apparatus for selectively coupling a signal between an input port and an output port in a first selectable operating mode and for not coupling a signal between the input port and the output port in a second selectable operating mode comprises a pair of diodes having respective first electrodes of a first type and respective second electrodes of a second type, the diodes being coupled in series. The respective first electrodes are coupled to a circuit point and the respective second electrodes are coupled to respective ones of the input port and the output port. A shunt diode has a first electrode of the first type and a second electrode of the second type coupled to a point of reference potential and the circuit point, respectively. A transistor having a control electrode has its principal controllable conduction path coupled between the circuit point and the point of reference potential.

A control arrangement is coupled to a control input for receiving a mode selection signal. The control arrangement is responsive to the mode selection signal selecting the first operating mode for applying bias potential tending to forward bias the pair of diodes and tending to reverse bias the shunt diode. The control arrangement is also coupled to the control electrode of the transistor for applying control potential to the control electrode of the transistor for rendering its principal controllable conduction path substantially non-conductive.

The control arrangement is responsive to the mode selection signal selecting the second operating mode for applying bias potential tending to forward bias the shunt diode and tending to reverse bias the pair of diodes. The control arrangement also applies control potential to the control electrode of the transistor for rendering its principal controllable conduction path substantially conductive.

In accordance with a further aspect of the invention, the control arrangement further includes bias control circuitry responsive to the state of conduction of the principal controllable conduction path of the transistor. The bias control circuitry applies forward bias to the pair of diodes and reverse bias to the shunt diode when the principal controllable conduction path is substantially non-conductive and applies forward bias to the shunt diode and reverse bias to the pair of diodes when the principal controllable conduction path is substantially conductive.

In accordance with another aspect of the invention, one of the respective first electrodes of the pair of diodes is coupled to the circuit point by way of a low-pass filter.

The sole FIGURE shows in circuit schematic form switch apparatus for switching RF signals in accordance with the principles of the invention.

Referring to the FIGURE, 10 is a control terminal for causing the switch apparatus to be in a selected one of its two operating modes. When a control voltage exceeding a first logic level is applied to control terminal 10, a signal applied to a first input terminal 12 is not coupled further and a signal applied to a second input terminal 14 is coupled to a first output terminal 16. When the control voltage applied to control terminal 10 is below a second logic level, approximately equal to ground potential, an input signal applied to input terminal 12 is coupled to output terminal 16 and an input signal applied to input terminal 14 is coupled to a second output terminal 18.

Signal coupling and decoupling is accomplished by three basic switch sections which are indicated in the FIGURE by the dashed line enclosures 20, 21 and 22, respectively. The configuration of the switch sections is in the form of a "Tee-section". In switch section 20, the series arms of the Tee comprise respective diodes 62 and 64 coupled "back-to-back" while the shunt arm comprises a parallel combination of a diode 66 and the collector-emitter path of a transistor 24, which is preferably a bipolar transistor. Diodes 62, 64 and 66 are preferably PIN (p-intrinsic-p) diodes, which are known to provide desirable characteristics for switching at high radio frequencies. When a signal is to be coupled through switch section 20, series diodes 62 and 64 are forward biased to exhibit a relatively low impedance, shunt diode 66 is reverse biased, and transistor 24 is cut off, thus causing the shunt arm to exhibit a high impedance. When a signal is not to be coupled through switch section 20, bias is applied tending to reverse bias series diodes 62 and 64 and tending to forward bias shunt diode 66, as will be explained later in more detail. Transistor 24 is biased into saturation, i.e. both its junctions are forward-biased so that the collector to emiter voltage is very small, thereby causing diodes 62 and 64 to be under high reverse bias and diode 66 to be heavily forward biased, as will also be explained later in more detail. The parallel combination of forward biased diode 66 and the collector-emitter path of saturated transistor 24 exhibits a relatively very low impedance, thus providing a relatively high degree of signal attenuation in cooperation with the relatively high impedance of reverse biased diodes 62 and 64. Transistor 24 thus controls the impedance of the series and shunt arm diodes of the switch section 20 as well as itself forming part of the shunt arm impedance.

Switch section 21 includes diodes 86, 82 and 94 and a transistor 42 which correspond to diodes 62, 64 and 66 and transistor 24 in switch section 20, respectively. However, switch section 21 differs somewhat in that a low-pass filter, comprising a series inductance 54 and shunt capacitances 53 and 55, is interposed in the series arm of the Tee. As will be explained in more detail later, the low-pass filter has no significant effect when a signal is to be coupled by switch section 21, whereas it increases the attenuation when a signal is not to be coupled.

Switch section 22 is essentially similar to switch section 20 and it includes diodes 88, 100 and 102, and a transistor 108, corresponding to diodes 62, 64 and 66 and transistor 24, respectively.

The illustrative embodiment will next be described in greater detail. Control terminal 10 is coupled to the base of a PNP transistor 19 by way of a current limiting resistor 11 and is also coupled to the base of an NPN transistor 24 by way of a current limiting resistor 26. The emitter of transistor 19 is bypassed to ground by way of a capacitor 13 and is coupled to the positive pole of a supply of operating voltage (not shown), for example, 12 volts DC, by way of a first supply terminal 30. The emitter of transistor 24 is coupled to a ground 32, ground being also coupled to the negative pole of the supply of operating voltage by way of a second supply terminal 34.

Transistors 19 and 24 control the potential of a first conductor 36 which is coupled to their respective collector electrodes, as will be explained in more detail later. When the control voltage applied to control terminal 10 exceeds the first logic level, approximately the potential of terminal 30, the collector current of transistor 19 is cut off and transistor 24 is biased into saturation. Accordingly, the potential of conductor 36 is low, approximately ground potential, since transistor 24 is saturated. When the control voltage applied to control terminal 10 is below the second logic level, the collector current of transistor 24 is cut off and transistor 19 is biased into saturation, thus causing the potential of conductor 36 to be high, approximately the potential of terminal 30. Conductor 36 is bypassed to ground for AC signals by way of capacitors 38 and 40.

Conductor 36 is further coupled to the respective base electrodes of transistors 42 and 44 by way of respective current limiting resistors 46 and 48. The emitters of transistors 42 and 44 are coupled to ground and to positive supply terminal 30, respectively.

A second conductor 50 is coupled to the collector of transistor 44 and to the collector of transistor 42 by way of a resistor 52 in series with an inductor 54. When the control voltage applied to terminal 10 exceeds the first logic level, the low potential on conductor 36 causes transistor 42 collector current to be cut off and transistor 44 to be biased into saturation. Accordingly, the potential of conductor 50 is high, approximately the potential of terminal 30.

When the control voltage applied to control terminal 30 is below the second logic level, the high potential of conductor 36 causes the collector current of transistor 44 to be cut off and transistor 42 to be biased into saturation. Accordingly, the potential of conductor 50 is relatively low, approximately ground potential. Conductor 50 is bypassed to ground for AC signals by way of capacitors 56 and 58.

Input terminal 12 is AC coupled by way of a capacitor 60 to the cathode of a first diode 62 whose anode is coupled to the anode of a second diode 64 and the cathode of a third diode 66 at a circuit point 68. Circuit point 68 is also coupled to conductor 36 by way of a resistor 70 and is directly coupled to the collector of transistor 24. The cathode of diode 62 is also coupled to ground by way of a resistor 72 and to conductor 50 by way of a resistor 74. The anode of diode 66 is coupled to conductor 50 by way of a resistor 76 and is bypassed to ground by way of a capacitor 78.

Output terminal 16 is coupled to ground by way of a resistor 80 and is also coupled to the respective cathodes of diode 64 and of a fourth diode 82 whose anode is coupled to the collector of transistor 42.

Input terminal 14 is AC coupled by way of a capacitor 84 to the respective cathodes of a fifth diode 86 and a sixth diode 88 at a circuit point 90 which is coupled to ground by way of a resistor 92. The anode of diode 86 is coupled to the junction of resistor 52 and inductor 54 and to the cathode of a seventh diode 94.

Inductor 54 is of sufficiently small inductance to be conveniently formed by a small length of conductor, such as a conductive strip on a printed circuit board. The capacitance associated with inductor 54 is indicated in the FIGURE by capacitors 53 and 55, coupled between the respective ends of inductor 54 and ground. Capacitors 53 and 55 need not necessarily represent actual capacitors, since the desired capacitance may be provided by stray or parasitic capacitances associated with inductor 54 and, for example, printed circuit board conductor patterns.

The anode of diode 94 is coupled to conductor 36 by way of a resistor 96 and is bypassed to ground by way of a capacitor 98. The anode of diode 88 is coupled to the anode of an eighth diode 100 and the cathode of a ninth diode 102 at a circuit point 104. Circuit point 104 is coupled to conductor 36 by way of a resistor 106 and to the collector electrode of a transistor 108 whose emitter electrode is grounded. The base electrode of transistor 108 is coupled to conductor 50 by way of a resistor 110. The anode of diode 102 is coupled to conductor 50 by way of resistor 112 and is bypassed to ground by way of a capacitor 114. The cathode of diode 100 is coupled to conductor 50 by way of a resistor 116. It is also coupled to ground by way of a resistor 118 and is capacitively coupled to output terminal 18 by way of a capacitor 120.

In operation, the logic level applied to terminal 10 is selected for the desired operating mode. For the purpose of description, assume first that the logic level applied to terminal 10 exceeds, i.e. is more positive than, the first logic level. As explained, this causes transistor 24 to be in saturation and causes conductor 36 to be approximately at ground potential and conductor 50 to be approximately at the potential of terminal 30. Diode 62 is therefore reverse biased and diode 66 is forward biased by the potential of conductor 50 and the ground potential of the collector of transistor 24. Diode 82 is forward biased by the potential of conductor 50 coupled to its anode through resistor 52, inductor 54, and resistor 80. This causes the cathodes of diodes 64 and 82 to be at a positive potential which causes diode 64 to be reverse biased since its anode is approximately at ground potential through the collector of transistor 24.

The path from input terminal 12 to output terminal 16 is therefore in the form of a "Tee-section" in which the series arms are reverse biased diodes 62 and 64 and which therefore exhibit respective high impedances. The shunt arm comprises the parallel combination of forward biased diode 66 and saturated transistor 24, both of which exhibit respective low impedances and form a parallel combination of particularly low impedance. The path from input terminal 12 to output terminal 16 therefore exhibits particularly high attenuation, which is desirable in an RF switch in its "OFF" condition. An input signal on input terminal 12 is therefore substantially blocked from reaching output terminal 16 and also from reaching output terminal 18, to which terminal 16 is coupled by way of diode 82.

It is noteworthy that transistor 24 performs a triple role in achieving high attenuation when it saturates. First, the saturated collector voltage of transistor 24 establishes the reverse bias voltages for obtaining the high impedance condition of series element diodes 62 and 64. Second, transistor 24 establishes the forward bias voltage for obtaining the low impedance condition of shunt diode 66. Third, the low saturation resistance of transistor 24 is coupled in parallel with that of shunt diode 66 to achieve the parallel combination of particularly low impedance.

Similarly, diode 100 is reverse biased and diode 102 is forward biased by the potential of conductor 50 and the collector of transistor 108 which is at approximately ground potential because transistor 108 is saturated by the base drive provided it by way of resistor 110 from conductor 50. Diode 86 is forward biased by the potential of conductor 50 through resistor 52 and resistor 92. This causes the cathodes of diodes 86 and 88 to be at a positive potential which causes diode 88 to be reverse biased since its anode is approximately at ground potential through the collector of transistor 108.

The path from input terminal 14 to output terminal 18 is similarly in the form of a "Tee-section" in which the series arms are reverse biased diodes 88 and 100 and which therefore exhibit high impedances. The shunt arm comprises the parallel combination of forward biased diode 102 and saturated transistor 108, both of which elements exhibit respective low impedances and form a parallel combination of particularly low impedance. The path from input terminal 14 to output terminal 18 therefore exhibits particularly high attenuation. Transistor 108 performs multiple functions similarly to transistor 24, as previously explained.

Input terminal 14 is coupled to output terminal 16 by way of the series connection of forward biased diodes 86 and 82 and inductor 54. Transistor 42 which is biased off by the approximately ground potential on conductor 36 coupled to the base of transistor 42 by way of resistor 46 exhibits a high impedance to ground at its collector which therefore has substantially no effect on the path coupling input terminal 14 to output terminal 16. The inductance of inductor 54 is selected to form a low pass "pi" section in conjunction with capacitors 53 and 55 having a cut-off frequency above the highest frequency of the signals of interest.

For the purpose of description, now assume that the logic level applied to terminal 10 is less than, i.e. is more negative than, the second logic level. As explained, this causes conductor 36 to be approximately at the potential of terminal 30 and conductor 50 to be at approximately ground potential. The positive potential applied to circuit point 68 by conductor 36 by way of resistor 70 reverse biases diode 66, since its anode is at approximately ground potential. Transistor 24 is biased off by the approximately ground potential on terminal 10, applied to its base by way of resistor 26. Diodes 62 and 64, whose cathodes are coupled to ground by resistors 74 and 80 respectively, are forward biased by the positive potential of circuit point 68. Transistor 42 is biased into saturation by the positive potential on conductor 36 applied to its base by way of resistor 46. This causes its collector to apply approximately ground potential to the anode of diode 82 whose cathode is maintained at a positive potential by forward biased diode 64. Diode 82 is therefore reverse biased. A signal at input terminal 12 is therefore coupled to output terminal 16 by way of forward biased diodes 62 and 64 and is not coupled to terminal 18.

Diode 94 is forward biased by the positive potential on conductor 36 applied to its anode by way of resistor 96 and approximately ground potential applied to its cathode by way of resistor 52. Diodes 88 and 100 are forward biased by the positive potential on conductor 36 applied by way of resistor 106 and approximately ground potential applied by way of resistors 92 and 116, respectively. Transistor 108 is biased off by the approximately ground potential applied to its base by way or reslstor 110. Anode of diode 86 is coupled by way of inductor 54 to the collector of transistor 42 which is in saturation and the resistance ratios of resistors 106, 92 and 116 are such that the potential difference which is applied between the anode and cathode of diode 86 causes it to be reverse biased. Diode 102 is reverse biased by the positive potential on conductor 36 applied to its cathode by way of resistor 106 and approximately ground potential applied to its anode by way of resistor 112. A signal at input terminal 14 is therefore coupled to output terminal 18 by way of forward biased diodes 88 and 100.

Parasitic coupling of a signal from input terminal 12 to output terminal 18 and of a signal from input terminal 14 to output terminal 16 is reduced to a very low amount by the action of inductor 54 which forms the series element of an attenuating network. Inductor 54 exhibits a relatively high reactance in the frequency range of interest in comparison with the corresponding shunt impedance for either direction of parasitic signal coupling. For one direction of parasitic signal coupling, the shunt impedance is provided by the low impedance of saturated transistor 42. In the other direction of parasitic signal coupling, the shunt impedance is provided by the low impedance of forward biased diode 94 which is bypassed to ground by capacitor 98.

It will be appreciated that the invention can be used with a different number of input and output ports. Further, additional low-pass filter sections can be introduced where the "OFF" state attenuation needs to be particularly great. These and other modifications are considered to be within the scope of the invention, which is defined by the following claims.

What is claimed is:

1. A system including a signal input port and a signal output port; a control input for receiving a mode selection signal; and signal switch apparatus for coupling a signal between said input port and said output port when a first operating mode is selected in response to said mode selection signal and substantially not coupling said signal between said ports when said second operating mode is selected in response to said mode selection signal, said signal switch apparatus comprising:

a pair of diodes having respective first electrodes of a first type and respective second electrodes of a second type, said diodes being coupled in series with said respective first electrodes being coupled to a circuit point and said respective second electrodes being coupled to respective ones of said input port and said output port;

a shunt diode having a first electrode of said first type and a second electrode of said second type, said first and second electrodes of said shunt diode being coupled to a point of reference potential and to said circuit point, respectively;

transistor means having a control electrode and having a principal controllable conduction path coupled between said circuit point and said point of reference potential; and control means coupled to said control input and being responsive to said mode selection signal selecting said first operating mode for applying bias potential tending to forward bias said pair of diodes and tending to reverse bias said shunt diode, and for applying control potential to the control electrode of said transistor means for rendering substantially non-conductive the principal controllable conduction path thereof;

said control means being responsive to said mode selection signal selecting said second operating mode for applying bias potential tending to forward bias said shunt diode, tending to reverse bias said pair of diodes and for applying control potential to the control electrode of said transistor means for rendering substantially conductive the principal controllable conduction path thereof.

2. The system recited in claim 1 wherein said control means further includes bias control means responsive to the state of conduction of said principal controllable conduction path of said transistor means for applying forward bias to said pair of diodes and for applying reverse bias to said shunt diode when said principal controllable conduction path is substantially non-conductive and for applying forward bias to said shunt diode and for applying reverse bias to said pair of diodes when said principal controllable conduction path is substantially conductive.

3. The system recited in claim 2 wherein said transistor means comprises a bipolar transistor and said diodes are PIN diodes.

4. The system recited in claim 3 wherein said control potential applied to said control electrode of said transistor means for rendering substantially conductive the principal controllable conduction path thereof causes said transistor to be saturated.

5. The system recited in claim 4 wherein said respective second electrodes are coupled to respective ones of said input port and said output port by way of respective capacitances.

6. The system recited in claim 5 wherein said second electrode of said shunt diode is capacitively coupled to said point of reference potential.

7. The system recited in claim 1 wherein one of said respective first electrodes of said first pair of diodes is coupled to said circuit point by way of low-pass filter means.

8. The system recited in claim 7 wherein said low-pass filter means comprises series inductor means, and shunt capacitor means.

9. The system recited in claim 8 wherein said low-pass filter means exhibits a cut-off frequency sufficiently high for passing said signals being coupled.

10. The system recited in claim 9 wherein said control means further includes bias control means responsive to the state of conduction of said principal controllable conduction path of said transistor means for applying forward bias to said pair of diodes and for applying reverse bias to said shunt diode when said principal controllable conduction path is substantially non-conductive and for applying forward bias to said shunt diode and for applying reverse bias to said pair of diodes when said principal controllable conduction path is substantially conductive.

11. The system recited in claim 10 wherein said respective diodes are PIN diodes and said transistor means comprises a bipolar transistor.

12. The system recited in claim 11 wherein said control potential applied to said control electrode of said transistor means for rendering substantially conductive said principal controllable conduction path thereof causes said transistor to saturate.

13. The system recited in claim 12 wherein said bias potential is applied by said control means through resistance means.

14. The system recited in claim 13 wherein said respective second electrodes of said pair of diodes are capacitively coupled to respective ones of said input and output ports.

15. Switch apparatus having first and second selectable operating modes, including a signal input port and a signal output port; a control input for receiving a mode selection signal; said switch apparatus coupling a signal between said input port and said output port when said first operating mode is selected in response to said mode selection signal and substantially not coupling said signal between said ports when said second operating mode is selected in response to said mode selection signal, said signal switch apparatus further comprising:

low-pass filter means exhibiting a cut-off frequency sufficiently high for passing said signal being coupled in said first operating mode and having a first end coupled to a circuit point and having a second end;

a pair of diodes having respective first electrodes of a first type and having respective second electrodes of a second type, said diodes being coupled in series with one of said first electrodes being coupled to said second end of said filter means and the other of said first electrodes being coupled to said circuit point and said respective second electrodes being coupled to respective ones of said input port and said output port, a shunt diode having a first electrode of said first type and a second electrode of said second type, said first and second electrodes of said shunt diode being coupled to a point of reference potential and to said circuit point respectively, and transistor means having a control electrode and having a principal controllable conduction path coupled between said circuit point and said point of reference potential; and control means coupled to said control input and being responsive to said mode selection signal selecting said first operating mode for applying bias potential tending to forward bias said pair of diodes and tending to reverse bias said shunt diode, and for applying control potential to the control electrode of said first transistor means for rendering substantially non-conductive the principal controllable conduction path thereof;

said control means being responsive to said mode selection signal selecting said second operating mode for applying bias potential tending to forward bias said shunt diode, tending to reverse bias said pair of diodes and for applying control potential to the control electrode of said transistor means for rendering substantially conductive the principal controllable conduction path thereof.

16. The switch apparatus recited in claim 15 wherein said low-pass filter means comprises series inductance means and shunt capacitance means.

17. The switch apparatus recited in claim 16 wherein said control means further includes bias control means responsive to the state of conduction of said principal controllable conduction path of said transistor means for applying forward bias to said pair of diodes and for applying reverse bias to said shunt diode when said principal controllable conduction path is substantially non-conductive and for applying forward bias to said shunt diode and for applying reverse bias to said pair of diodes when said principal controllable conduction path is substantially conductive.

18. The switch apparatus recited in claim 17 wherein said respective diodes are PIN diodes and said transistor means comprises bipolar transistor means.

* * * * *